(12) United States Patent
Ishikawa (10) Patent No.: US 10,006,803 B2
(45) Date of Patent: Jun. 26, 2018

(54) SENSOR SIGNAL CONTACT DETECTOR CIRCUIT

(71) Applicant: MITUTOYO CORPORATION, Kawasaki-shi, Kanagawa (JP)

(72) Inventor: Nobuhiro Ishikawa, Ushiku (JP)

(73) Assignee: Mituoyo Corporation, Kawasaki-shi (JP)

( * ) Notice: Subject to any disclaimer, the term of this patent is extended or adjusted under 35 U.S.C. 154(b) by 184 days.

(21) Appl. No.: 14/740,707

(22) Filed: Jun. 16, 2015

(65) Prior Publication Data

US 2015/0369655 A1    Dec. 24, 2015

(30) Foreign Application Priority Data

Jun. 18, 2014   (JP) .................. 2014-125139

(51) Int. Cl.
*G01H 11/08* (2006.01)
*G01B 7/012* (2006.01)
(Continued)

(52) U.S. Cl.
CPC ............ *G01H 11/08* (2013.01); *G01B 7/012* (2013.01); *G06F 3/03545* (2013.01); *G06F 3/0433* (2013.01); *H03K 5/088* (2013.01)

(58) Field of Classification Search
CPC ....... G01B 7/002–7/003; G01B 21/045; G01B 7/012; G01H 11/08; G06F 3/0433; G06F 3/03545; H03K 5/082; H03K 5/088
(Continued)

(56) References Cited

U.S. PATENT DOCUMENTS 4,531,158 A * 7/1985 Murakami ......... H04N 5/23212
                                                    348/347
5,949,257 A * 9/1999 Ishikawa ............... G01B 7/002
                                                     327/34
(Continued)

FOREIGN PATENT DOCUMENTS

EP     2120004 A1    11/2009
GB     2318232 A      4/1998
(Continued)

OTHER PUBLICATIONS

Kim et al, Sample & Hold Circuits, 2011, Department of Computer Science & Engineering The Pennsylvania State University Mixed Signal CHIP Design Lab CSE 577.*

(Continued)

*Primary Examiner* — Peter Macchiarolo
*Assistant Examiner* — David L Singer
(74) *Attorney, Agent, or Firm* — Rankin, Hill & Clark LLP (57) ABSTRACT

A contact detector circuit that detects a change in a DC sensor signal based on a change in a physical amount to be detected includes: a reference signal generation circuit that generates a reference signal based on the DC sensor signal; a trigger signal output circuit that compares the DC sensor signal with the reference signal and outputs a trigger signal based on a result of the comparison; and a sampling-and-holding circuit that holds the reference signal when the trigger signal is started to be outputted and outputs the held reference signal to the trigger signal output circuit while the trigger signal is outputted. The trigger signal output circuit uses the reference signal outputted by the sampling-and-holding circuit for the comparison with the DC sensor signal while the trigger signal is outputted.

4 Claims, 9 Drawing Sheets

(51) Int. Cl.
*G06F 3/0354* (2013.01)
*G06F 3/043* (2006.01)
*H03K 5/08* (2006.01)

(58) Field of Classification Search
USPC ..... 327/72, 517; 73/579, 661, 593, 645–648
See application file for complete search history.

(56) References Cited

U.S. PATENT DOCUMENTS

| | | | |
|---|---|---|---|
| 6,392,450 B2 * | 5/2002 | Yoshida | H03K 5/082 327/68 |
| 6,937,070 B2 * | 8/2005 | Ishikawa | G01B 7/003 327/50 |
| 7,053,806 B1 * | 5/2006 | Rao | H03M 1/1028 341/118 |
| 2005/0047316 A1 * | 3/2005 | Yamamoto | G11B 7/00456 369/116 |

FOREIGN PATENT DOCUMENTS

| | | |
|---|---|---|
| JP | 6147502 A * | 3/1986 |
| JP | S61-51503 | 3/1986 |
| JP | H04-326001 | 11/1992 |
| JP | 06-221806 | 8/1994 |
| JP | 10-111143 | 4/1998 |
| JP | H11-223524 A | 8/1999 |
| JP | 2002-310727 | 10/2002 |
| JP | 2006-220556 | 8/2006 |
| JP | 2009-276238 | 11/2009 |
| WO | 01/79794 A1 | 10/2001 |
| WO | 2009/112819 A2 | 9/2009 |
| WO | 2009/112819 A3 | 9/2009 |

OTHER PUBLICATIONS

Espacenet machine translation of JP S6147502 A.*
Mariun et al, Simulation, Design and Construction of High Voltage Dc Power Supply at 15 kV Output Using Voltage Multiplier Circuits, Am. J. Applied Sci., 3 (12): 2178-2183, 2006.*
European Search Report dated Oct. 28, 2015, 4 pages.
Japanese Office Action with English Translation dated Apr. 3, 2018, 5 pages.

* cited by examiner

SENSOR SIGNAL CONTACT DETECTOR CIRCUIT

The entire disclosure of Japanese Patent Application No. 2014-125139 filed Jun. 18, 2014 is expressly incorporated by reference herein.

TECHNICAL FIELD

The present invention relates to a sensor signal detector, more specifically to a contact detector circuit of a vibration touch signal probe that detects a contact based on a change in vibration status of a stylus.

BACKGROUND ART

Height gauges, coordinate measuring machines, profile measuring machines and the like have been known as measuring machines that measure shape and dimension of an object to be measured (sometimes simply referred to as an "object" hereinafter). Among such measuring machines, contact-type measuring machines use a touch signal probe that is configured to detect a contact with an object to be measured. There are various types of known touch signal probes, one of which is an ultrasonic touch trigger probe (see, for instance, Patent Literature 1: JP-A-06-221806). The ultrasonic touch trigger probe applies vibrations to a stylus using a piezoelectric element and monitors amplitudes and/or frequency change of the vibrations to detect a contact with an object.

Figure 6:
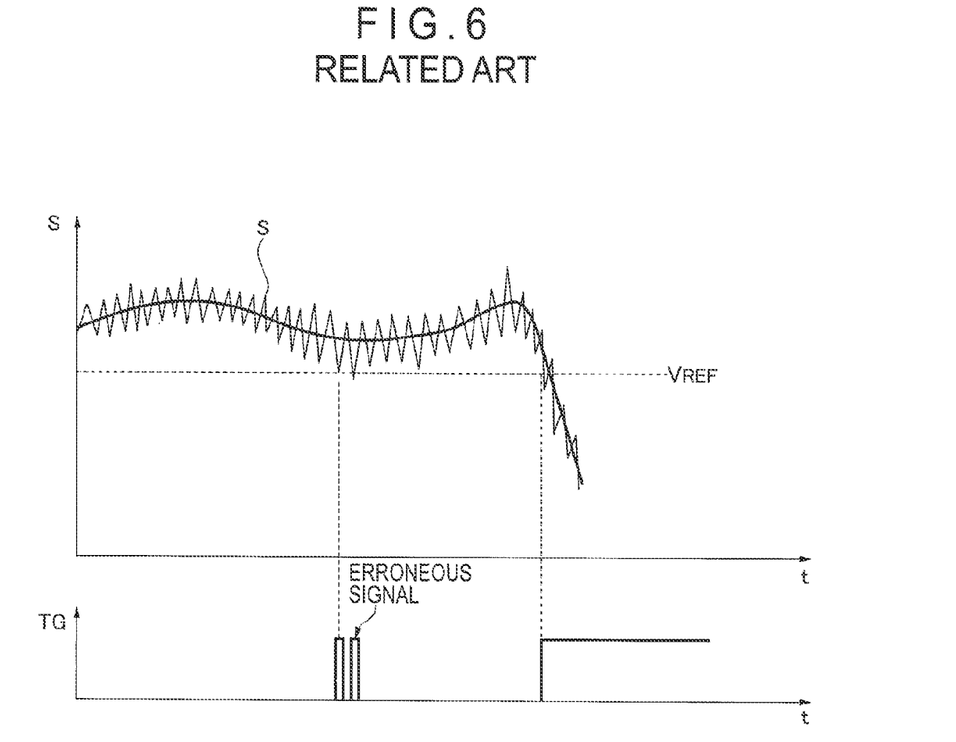
FIG. 6 is a graph showing an example of a contact detection using a first typical contact detector circuit.

In detecting a contact using the piezoelectric element, the piezoelectric element is resonantly excited by a positive feedback control and generates a detection output signal in a form of a sinusoidal signal, which is outputted from a detection electrode of the piezoelectric element. The amplitude and frequency of the sinusoidal signal varies when a contact piece touches an object to be measured. For instance, in order to detect a contact based on amplitude information, an amplitude change detector is used in a first typical contact detector circuit as shown in FIG. 6. The amplitude change detector detects and extracts only the amplitude information from the obtained sinusoidal signal to obtain a DC sensor signal S, and generates a trigger signal TG at a point where a DC level of the DC sensor signal S is rapidly decreased due to the contact. The amplitude change detector generates the trigger signal TG based on a comparison between the DC sensor signal S and a constant reference electric potential VREF.

However, when the reference electric potential VREF of a constant value is used for contact detection of a probe, the probe may erroneously detect a contact with an object although the probe actually does not touch the object. The erroneous detection occurs for the following reason. In most cases, the DC sensor signal S has a DC offset component, a low-frequency state change component showing a slow amplitude change due to beat etc. and a high-frequency noise component that are superimposed with each other. Accordingly, depending on a setting of the reference electric potential VREF, the low-frequency state change component and the high-frequency noise components are overlapped with the reference electric potential VREF at a point other than the point at which the DC level of the DC sensor signal S rapidly varies as shown in FIG. 6. At such a point, the amplitude change detector occasionally erroneously detects that the probe touches the object and outputs a detection signal in error. The erroneous detection accounts for a large part of errors in the physical amount to be detected.

Figure 7:
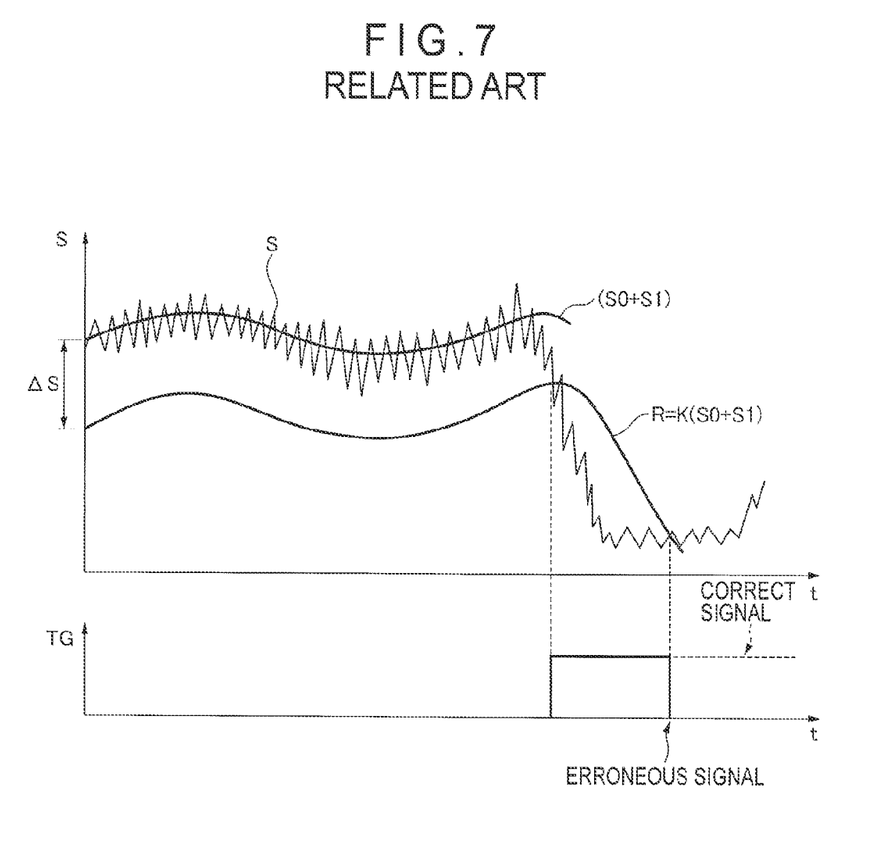
FIG. 7 is a graph showing an example of a contact detection using a second typical contact detector circuit.

In order to avoid such an erroneous detection, as shown in FIG. 7, the DC offset component S0 and the low-frequency state change component S1 are extracted from the DC sensor signal S using a low-pass filter, and the amplitude of the DC sensor signal (S0+S1) including the low-frequency state change component S1 is converted to obtain a reference signal (signal K(S0+S1)) (see, for instance, Patent Literature 2: JP-A-10-111143).

However, as shown in FIG. 7, when, for instance, the touch signal probe is kept in contact with the object, a second typical contact detector circuit shown in FIG. 7 sometimes detects that the probe is out of contact with the object and issues an erroneous signal even while the probe is still in contact with the object.

A technique for avoiding the above-described erroneous contact detection and erroneous non-contact detection has been proposed (see, for instance, Patent Literature 3, JP-A-2009-276238).

The technique disclosed in the Patent Literature 3 is based on the disclosure of the above-described Patent Literature 2.

Figure 8:
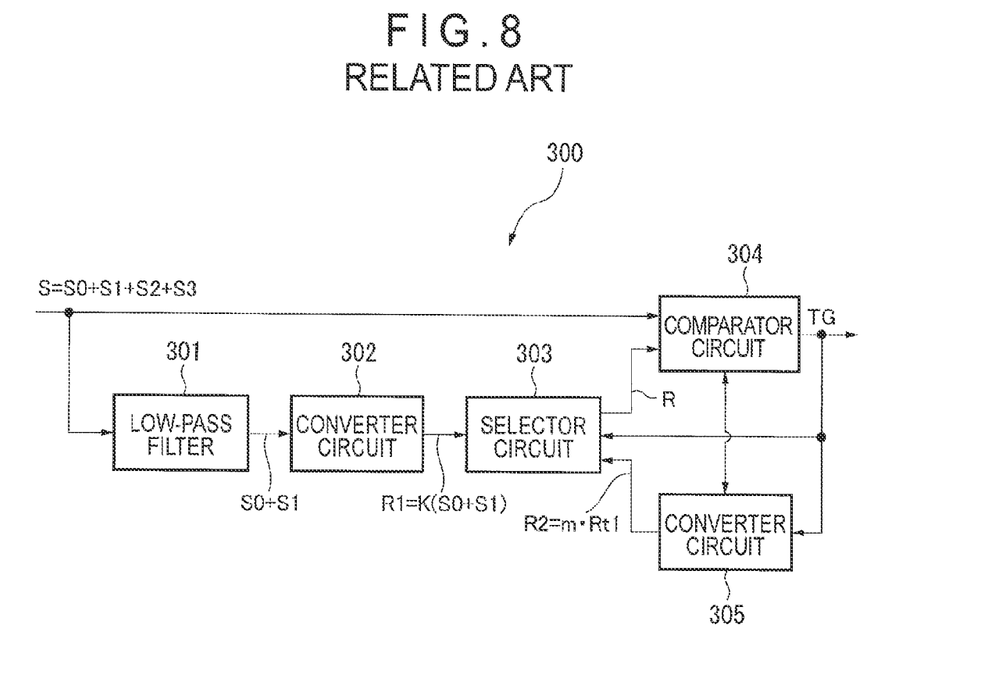
FIG. 8 is a block diagram showing a third typical contact detector circuit.

As shown in FIG. 8, a third typical contact detection circuit 300 disclosed in the Patent Literature 3 includes a low-pass filter 301, a converter circuit 302, a selector circuit 303, a comparator circuit 304 and a converter circuit 305.

Figure 9:
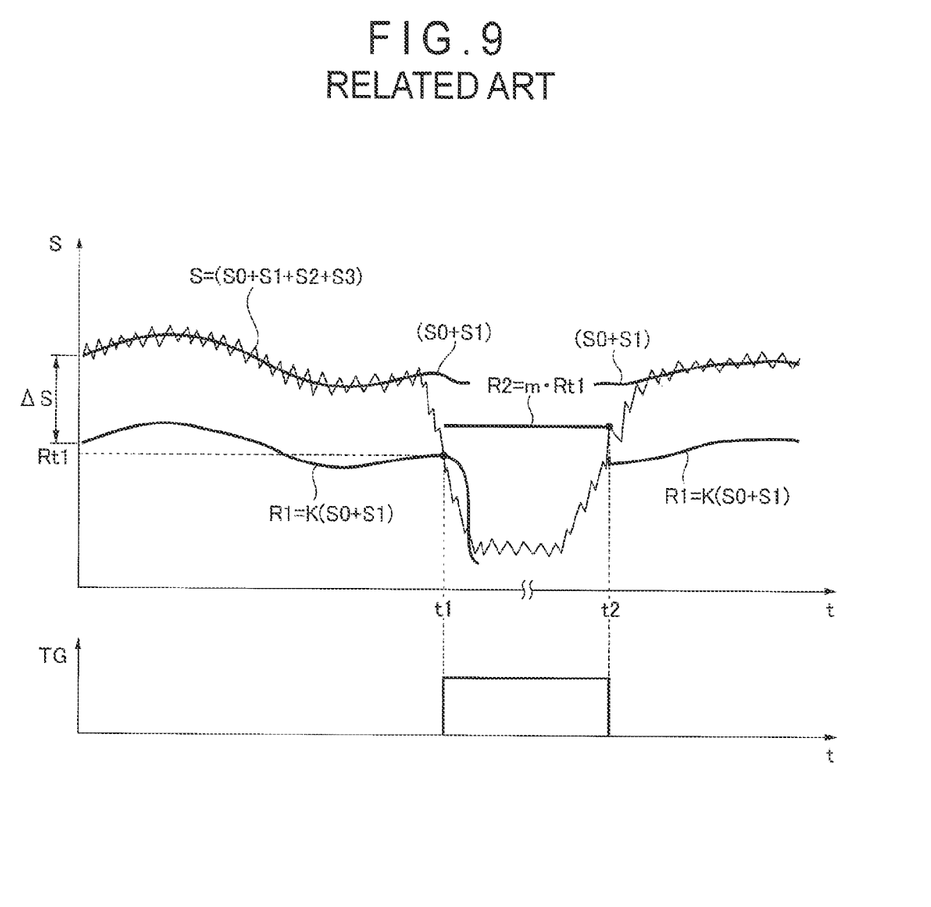
FIG. 9 is a graph showing an example of a contact detection using the third typical contact detector circuit.

As shown in FIG. 9, the above-described third typical contact detection circuit 300 compares a DC sensor signal S and a reference signal R using the comparator circuit 304, and generates a trigger signal TG when the DC sensor signal S falls below the reference signal R.

When the trigger signal TG is not generated by the comparator circuit 304, the selector circuit 303 uses a signal R1=K(S0+S1) obtained by converting the amplitude of the DC sensor signal (S0+S1) as the reference signal R. The value of R1 varies in accordance with (S0+S1).

On the other hand, when the trigger signal TG is generated by the comparator circuit 304, the second converter circuit 305 calculates a signal R2=m·Rt1 with reference to a sampling value Rt1 of the reference signal R at a time t1 when the trigger signal TG is outputted. The selector circuit 303 uses the calculated signal R2 is used as the reference signal R. The value of the signal R2 is constant and unchanged.

When the signal S exceeds the signal R2=M=Rt1 (the reference signal) the trigger signal TG declines (time t2), the selector circuit 303 again uses the signal R1 as the reference signal R.

However, the technique disclosed in the Patent Literature 3 requires calculations of both of the signal R1=K(S0+S1) and the signal R2=m·Rt1 for obtaining the reference signal R, so that the arrangement becomes complicated.

SUMMARY OF THE INVENTION

The invention has been reached in view of the above circumstances. An object of the invention is to provide a sensor signal detector that is capable of appropriately detecting a sensor signal with a simple arrangement.

A sensor signal detector according to an aspect of the invention is configured to detect a change in a DC sensor signal based on a change in a physical amount to be detected, the sensor signal detector including: a reference signal generator that is configured to generate a reference signal from the DC sensor signal; a trigger signal output unit that is configured to compare the DC sensor signal with the reference signal and outputs a trigger signal based on a result of a comparison between the DC sensor signal and the reference signal; and a reference signal holder that is configured to hold the reference signal when the trigger signal is started to be outputted, the held reference signal being outputted to the trigger signal output unit while the trigger signal is outputted, the trigger signal output unit using the reference signal outputted by the reference signal holder for the comparison between the DC sensor signal and the reference signal while the trigger signal is outputted.

In the above aspect of the invention, the reference signal is generated from the DC sensor signal, the DC sensor signal is compared with the reference signal and the trigger signal is outputted based on a result of the comparison. Further, when the trigger signal is outputted, the reference signal when the trigger signal is started to be outputted is held and the held reference signal is outputted to the trigger signal output unit while the trigger signal is outputted.

As described above, the reference signal at the start of the output of the trigger signal is held and the held reference signal is used for the subsequent comparison with the sensor signal. With the above arrangement, the DC sensor signal can be stably compared with the reference signal while the trigger signal is outputted, thereby accurately detecting the sensor signal.

In the sensor signal detector of the above aspect of the invention, the reference signal may preferably be held at the reference signal holder by storing an electric charge in a capacitor to hold a voltage.

In the above arrangement, the reference signal is held at the reference signal holder by storing an electric charge in a capacitor to hold a voltage. In other words, the reference signal holder holds the reference signal not by software but by a hardware including the capacitor. Accordingly, unlike an instance in which the reference signal is calculated and held, it is not necessary to provide software for holding the reference signal, so that the structure of the sensor signal detector can be simplified.

In the sensor signal detector according to the above aspect of the invention, the DC sensor signal may preferably include a DC-level fluctuation component, a low-frequency state change component and a high-frequency noise component being superimposed with each other, the sensor signal detector may further include a low-pass filter that is configured to receive the DC sensor signal and block the high-frequency noise component and the DC-level fluctuation component in the received DC sensor signal to output the low-frequency state change component, and the DC sensor signal passing through the low-pass filter may preferably be used for the comparison with the reference signal in the trigger signal output unit.

In the above arrangement, the DC sensor signal passes through the low-pass filter, so that the high-frequency noise component and the rapidly varying DC-level fluctuation component (component to be detected) are removed, thereby obtaining the DC sensor signal including solely the low-frequency state change component. The DC sensor signal thus obtained is used for the comparison with the reference signal, so that the sensor signal can be more accurately detected.

In the sensor signal detector according to the above aspect of the invention, the DC sensor signal may preferably be obtained by extracting amplitude information from a sinusoidal output signal of a touch signal probe driven by a piezoelectric element.

The DC sensor signal obtained by extracting the amplitude information from the sinusoidal output signal generated by the touch signal probe is a composite signal in which various components are superimposed. A state change component due to a temperature change, time-dependent change or the like is contained in the various components. As described above, since the reference signal is generated from the DC sensor signal in the above aspect of the invention, the state change component is contained in both of the DC sensor signal and the reference signal. In other words, the influence of the status change is not exerted on the comparison between the DC sensor signal and the reference signal. Accordingly, the DC level changes can be reliably detected only by appropriately setting a ratio of the amplitude conversion of the noise component.

DESCRIPTION OF EMBODIMENT(S)

Exemplary embodiment(s) of the invention will be described below with reference to the attached drawings.

Figure 1:
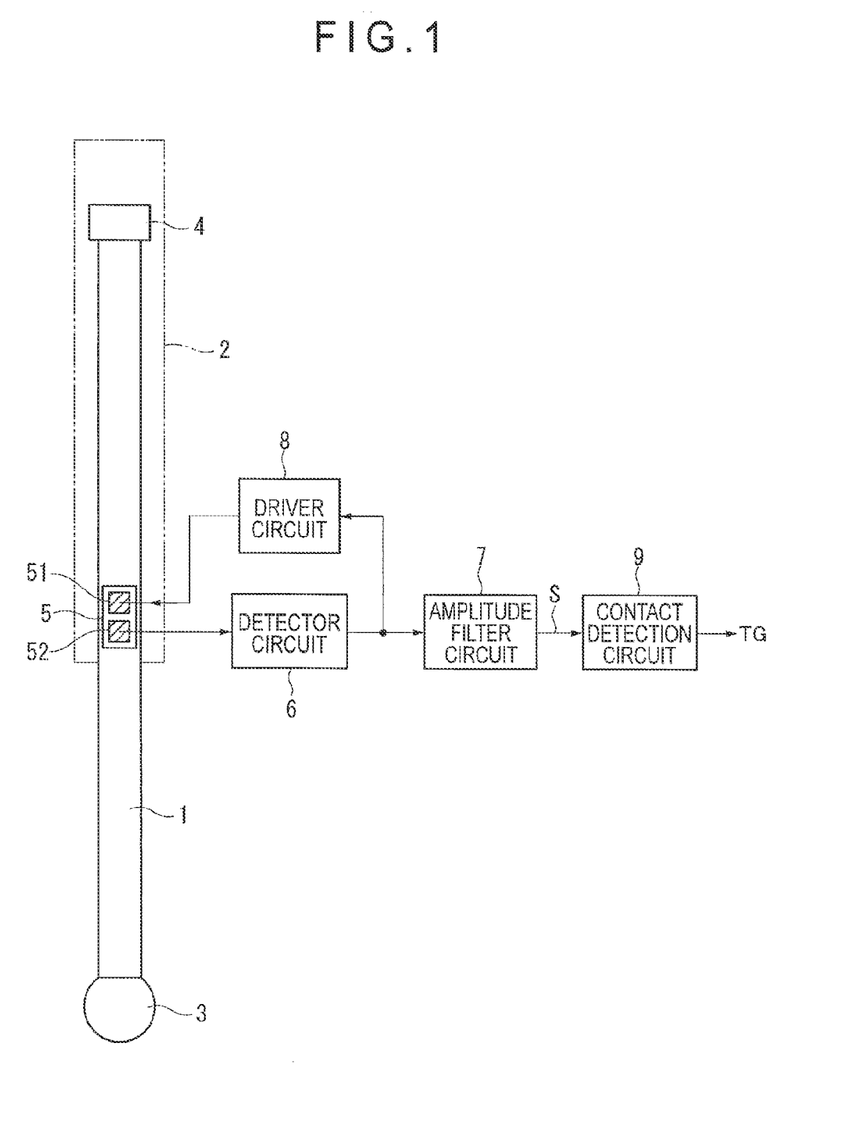
FIG. 1 is a schematic illustration of a contact sensor using a sensor signal detector according to an exemplary embodiment of the invention as a contact detector circuit.

FIG. 1 is a schematic illustration of a contact sensor using a sensor signal detector according to an exemplary embodiment of the invention as a contact detector circuit 9. The contact sensor includes a stylus 1 having a spherical contact piece 3 at an end thereof. The stylus 1 also includes a balancer 4 for keeping an attitude of the stylus 1 at a base end thereof. The stylus 1 is held by a stylus holder 2 approximately at a middle portion in an axial direction thereof.

A piezoelectric element 5 that is configured to apply vibrations to the stylus 1 is attached approximately to the middle portion of the stylus 1. The piezoelectric element 5 includes a vibration electrode 51 configured to apply vibrations to the stylus 1 and a detection electrode 52 configured to detect a contact of the contact piece 3. A drive signal is sent to the vibration electrode 51 from a driver circuit 8.

The detection electrode 52 generates a mechanical-electrical conversion output signal. The mechanical-electrical conversion output signal is detected by a detector circuit 6. An output signal of the detector circuit 6 is sent to the driver circuit 8 by a positive feedback. The feedback control excites the piezoelectric element 5 at a predetermined resonance frequency.

The detector circuit 6 outputs a detection output signal in a form of a sinusoidal signal of which amplitude decreases when the contact piece 3 touches an object. An amplitude filter circuit 7 detects the sinusoidal signal obtained by the detection electrode 52 of the piezoelectric element 5 of the detector circuit 6, and extracts only amplitude information of the sinusoidal signal to output a DC sensor signal S. The amplitude filter circuit 7 exemplarily includes a full-wave rectifier for converting AC (Alternating Current) into DC (Direct Current), and a smoothing circuit for smoothing an AC component remaining after a rectification.

The contact detector circuit 9 detects a variation in a DC-level fluctuation component S3 (see FIGS. 2 and 4) in the DC sensor signal S that rapidly decreases due to a contact with the contact piece 3, and outputs a trigger signal TG.

Figure 2:
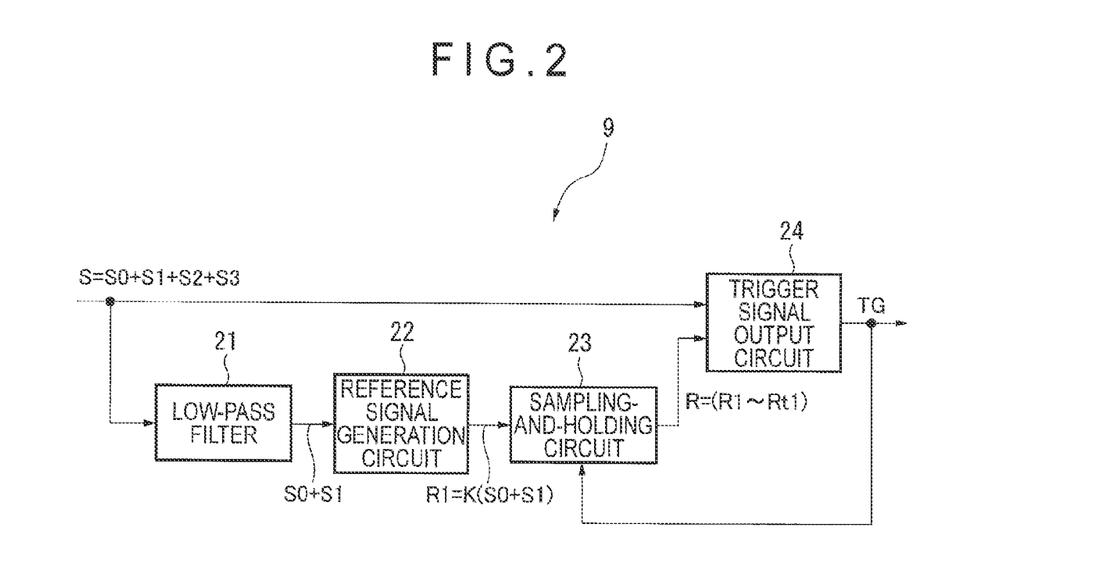
FIG. 2 is a block diagram showing the contact detector circuit.

Next, details of the arrangement of the contact detector circuit 9 will be described below with reference to a block diagram shown in FIG. 2.

The contact detector circuit 9 includes: a low-pass filter 21 (low-pass filter) into which the DC sensor signal S is inputted; a reference signal generation circuit 22 (reference signal generator) that converts a level of an output signal of the low-pass filter 21; a sampling-and-holding circuit (reference signal holder) 23 that samples and/or holds an output signal of the reference signal generation circuit 22; and a trigger signal output circuit (trigger signal output unit) 24 that generates and outputs a trigger signal TG based on a result of a comparison between the DC sensor signal S and an output signal of the sampling-and-holding circuit 23.

The DC sensor signal S inputted to the low-pass filter 21 is a composite signal in which a DC offset component S0, a low-frequency state change component S1 (representing variation due to temperature change and time-dependent change), a high-frequency noise component S2 and a DC-level fluctuation component S3 (a signal component caused when the contact piece 3 touches an object), all of which are superimposed (i.e. S=S0+S1+S2+S3).

The low-pass filter 21 blocks the high-frequency noise component S2 and the DC-level fluctuation component S3 and passes only the DC offset component S0 and the low-frequency state change component S1 (i.e. S0+S1) out of the components of the DC sensor signal S.

The reference signal generation circuit 22 multiplies the output signal (S0+S1) with a coefficient K (0<K<1) to output a signal R1=K(S0+S1). The signal R1 is selectively used as a later-described reference signal R.

It should be noted the value of the coefficient K is determined in consideration of a magnitude of the amplitude of the high-frequency noise component S2. Specifically, the coefficient K is determined so that the magnitude of $\Delta S = (1-K)(S0+S1)$ becomes greater than a maximum value of the amplitude (|S2|) of the high-frequency component S2, thereby achieving a highly accurate contact detection without being influenced by the high-frequency noise component S2.

However, when the coefficient K is set excessively small, the trigger signal TG is generated at a timing different from an actual contact time between the contact piece 3 and the object. Accordingly, the coefficient K is preferably set as large as possible as long as the contact detection is not influenced by the high-frequency noise component S2.

The sampling-and-holding circuit 23 sequentially samples (acquires) the signal R1=K(S0+S1) when the trigger signal TG is not outputted from a later-described trigger signal output circuit 24 and sequentially outputs the obtained signal R1 as the reference signal R to the trigger signal output circuit 24. On the other hand, the sampling-and-holding circuit 23 holds a signal Rt1 when the trigger signal TG is started to be outputted, and keeps outputting the held signal to a comparator as the reference signal R while the trigger signal TG is kept on being outputted. In other words, the output signal of the sampling-and-holding circuit 23 the signal R1 (a variable value) when the trigger signal TG is not outputted, whereas the output signal becomes signal Rt 1 (a fixed value) when the trigger signal TG is outputted.

Figure 3:
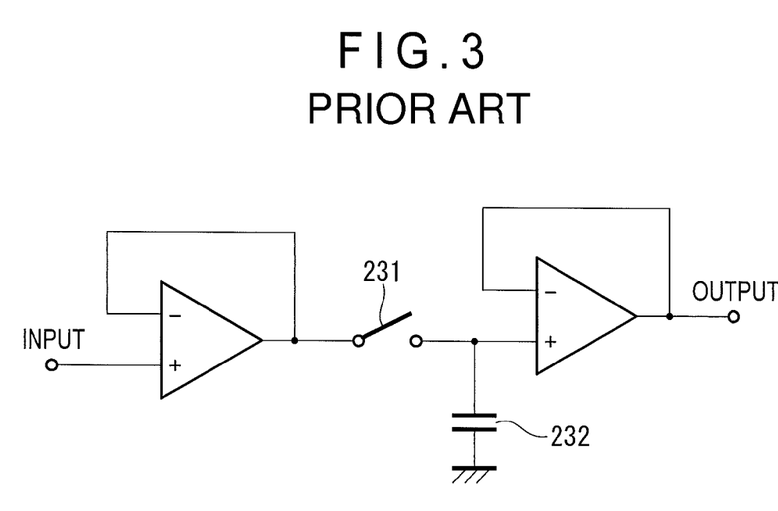
FIG. 3 is a circuit diagram showing a sampling-and-holding circuit.

As shown in FIG. 3, the sampling-and-holding circuit 23 includes a switch 231 and a capacitor 232. The switch 231 is configured to be set ON when the trigger signal TG is not outputted and to be set OFF when the trigger signal TG is outputted.

The sampling of the signal R1 by the sampling-and-holding circuit 23 is performed when the switch 231 is set ON. On the other hand, the reference signal R is held by the sampling-and-holding circuit 23 when the switch 231 is set OFF.

When the switch 231 is set OFF, an electric charge of the capacitor 232 is held, where the output reference signal R is held at a value when the switch 231 is set OFF irrespective of the variation in the signal R1=K(S0+S1) to be inputted. It should be noted that the sampling-and-holding circuit 23 is commercially available and the commercially available product can be directly used in this exemplary embodiment.

The trigger signal output circuit 24 compares the DC sensor signal S (=S0+S1+S2+S3) with the reference signal R (=R1 or Rt1) outputted from the sampling-and-holding circuit 23. When the DC sensor signal S is smaller than the reference signal R, the trigger signal output circuit 24 generates and outputs the trigger signal TG.

Figure 4:
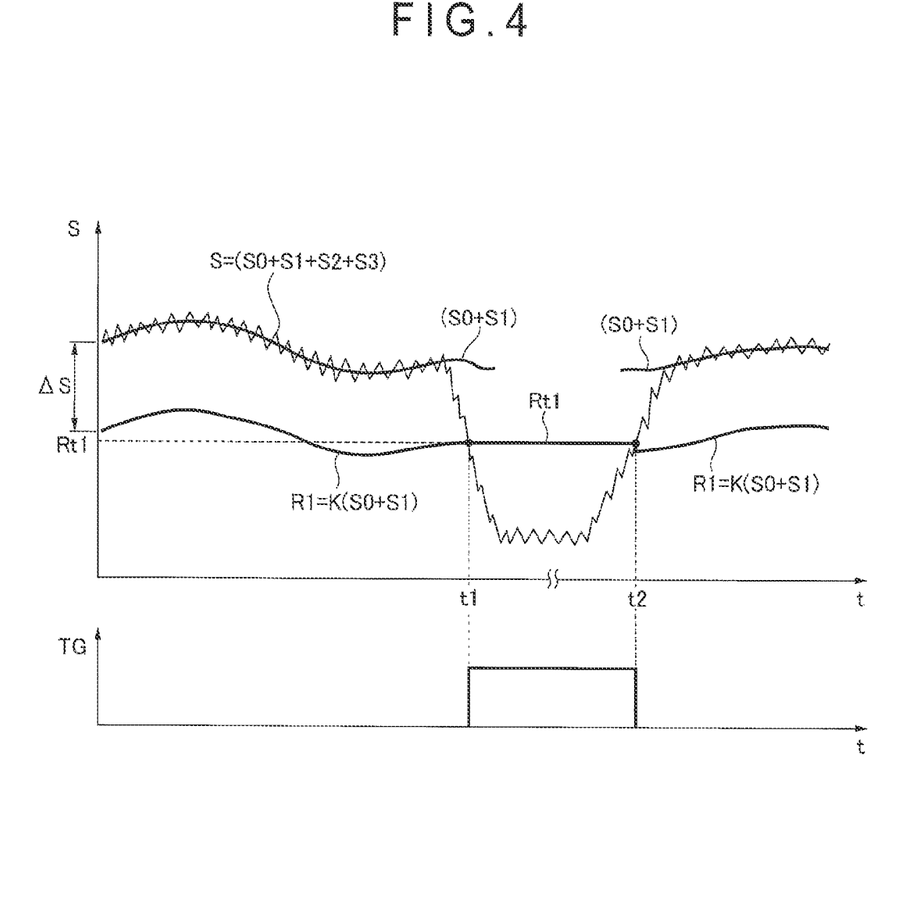
FIG. 4 is a graph showing a contact detection using the contact detector circuit.
Figure 5:
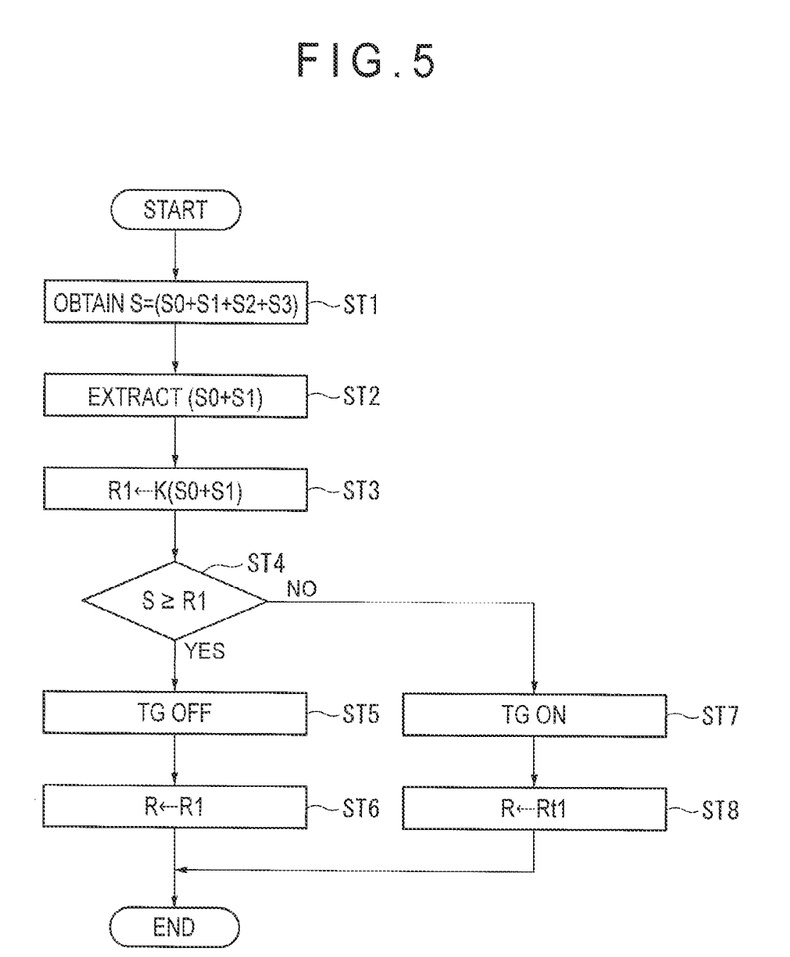
FIG. 5 is a flowchart showing an output process of a reference signal using the sampling-and-holding circuit.

Next, an operation of the contact detector circuit 9 of the exemplary embodiment will be described below with reference to a graph in FIG. 4 and a flowchart in FIG. 5.

In this exemplary embodiment, it is exemplarily supposed that: the contact piece 3 of the stylus 1 is initially separated from an object (not shown) (non-contact state); the contact piece 3 then is brought into contact with the object and the contact state between the contact piece 3 and the object is kept for a while; and the contact piece 3 is again separated from the object (transitioning into the non-contact state).

In this instance, when the DC sensor signal S is inputted to the low-pass filter 21 (Step 1 (abbreviated as "ST1" [ST2, ST3 . . . ] in the drawings), the high-frequency noise component S2 and the (transitional) DC-level fluctuation component S3 are blocked so that only the DC offset component S0 and the low-frequency state change component S1 (i.e. signal (S0+S1)) are extracted to be outputted (Step 2). The reference signal generation circuit 22 multiplies the output signal (S0+S1) of the low-pass filter 21 with a coefficient K (Step 3) to output the signal R1=K(S0+S1).

In the period before a time t1 (Step 4: YES), the contact piece 3 of the stylus 1 is not in contact with the object (non-contact state). Accordingly, the DC sensor signal S is greater than the reference signal R=R1. Since the trigger signal TG is not outputted during the non-contact state (S5), the switch 231 is set ON, and the sequentially changing signal R1=K(S0+S1) is outputted as the reference signal R (Step 6).

Subsequently, when the contact piece 3 is brought into contact with the object to run into a contact state, the DC sensor signal S rapidly decreases, so that the DC sensor signal S falls below the signal R1 at the time t1 (Step 4: YES→NO). Then, the trigger signal TG is outputted (Step 7), and the reference signal R is held by the sampling-and-holding circuit 23. As shown in FIG. 4, since the value of the signal R1 at the time t1 is Rt1, the reference signal R is held at the value Rt1 during the period from the time t1 to a time t2 (Step 8).

In other words, the reference signal R is switched from a variable value (signal R1) varying in accordance with an increase and decrease in the DC sensor signal S to a fixed value (signal Rt1) at the time t1. Since the contact state is kept in the period between the time t1 to the time t2, the reference signal R=Rt1 is compared with the DC sensor signal S.

Subsequently, when the contact piece 3 is out of contact with the object, the DC sensor signal S rapidly increases, so that the DC sensor signal S exceeds the signal R1 at the time t2 (Step 4: NO→YES). Then, since the output of the trigger signal TG is stopped (S5), the switch 231 is set ON, and the signal R1=K(S0+S1) is again outputted from the sampling-and-holding circuit 23 (Step 6). In other words, the reference signal R is switched from the fixed value (signal Rt1) to the variable value (the signal R1) after the time t2.

As described above, in this exemplary embodiment, when the trigger signal TG is not outputted (i.e. in the non-contact state of the contact piece 3), the signal R1 (variable component) derived from the DC sensor signal S is used as the reference signal R, whereas the signal Rt1 (fixed value) is used as the reference signal R when the trigger signal TG is outputted (i.e. in the contact state of the contact piece 3). By thus switching the reference signals R, the contact/non-contact of the contact piece 3 can be more accurately determined as compared to an instance where the variable signal R1 is kept being used as the reference signal R and an instance where the fixed value of the signal Rt1 is kept being used as the reference signal R.

Further, the fixed value of the signal R2 is set at the value of the reference signal R when the trigger signal TG is started to be outputted. The value of the reference signal R is set at the value of the signal R2 by being held at the value at the sampling-and-holding circuit 23. The sampling-and-holding circuit 23 can be easily provided using the switch 231 and the capacitor 232 and also is commercially available. Accordingly, as compared with the arrangement disclosed in the Patent Literature 3 in which the signal R2 (=m·Rt1) is calculated with a software, the structure of the contact detector circuit 9 can be simplified.

It should be understood that the scope of the present invention is not restricted to the above exemplary embodiment, but encompasses modification(s) and improvement(s) as long as such modification(s) and improvement(s) are compatible with an object of the invention.

For instance, though the amplitude of the DC-level fluctuation component S3 decreases when a contact is detected in the above exemplary embodiment, the invention is also applicable to an instance where the amplitude or the like of the DC-level fluctuation component S3 increases when a contact is detected. It should be noted that, in such an instance, the value of the coefficient K has to be set greater than 1 (K>1).

Though the signal R1 is calculated by multiplying the output signal (S0+S1) of the low-pass filter 21 with the coefficient K (i.e. R1=K(S0+S1)) in the above exemplary embodiment, the signal R1 may alternatively be calculated by subtracting a predetermined value L from the output signal (S0+S1) of the low-pass filter 21 (i.e. R1=S0+S1−L).

Though an instance in which the amplitude of the DC sensor signal S is extracted to detect a contact in a contact sensor using an ultrasonic touch trigger probe is exemplified in the above exemplary embodiment, the scope of the invention is not restricted thereto. For instance, the invention is applicable to an instance for detecting the frequency and/or phase of the DC sensor signal S to detect a contact based on the change in the frequency and/or phase. In other words, the invention is applicable to any sensor that employs a DC sensor signal S including a low-frequency state change component S1.

Though the sampling-and-holding circuit 23 in the above exemplary embodiment is provided by a hardware including the switch 231 and the capacitor 232, the sampling-and-holding circuit 23 may alternatively be provided by a software.

Though the contact piece 3 in the above exemplary embodiment keeps in contact with the object for a while from an initial non-contact state, and subsequently returns to the non-contact state, the invention is also applicable to an instance in which the contact piece 3 is not restored to the non-contact state from the contact state and is kept to be in the contact state for a long time.

Though the reference signal R is switched from the variable signal R1 to the signal Rt1 of the fixed value (Step 8) simultaneously with the output of the trigger signal TG (the time t1) (Step 7) in the above exemplary embodiment, it is not necessary that the signals are switched at the time t1 but may alternatively be switched at a predetermined time after the time t1.

Similarly, though the reference signal R is switched from the signal Rt1 of the fixed value to the variable signal R1 (S6) simultaneously with the stop of the output of the trigger signal TG (the time t2) (S5) in the above exemplary embodiment, it is not necessary that the signals are switched at the time t2 but may alternatively be switched a predetermined time after the time t2.

Though the sensor signal detector in the above exemplary embodiment is provided in a form of the contact detector circuit 9, the invention may alternatively be provided in a form of a pressure detector circuit and an acceleration detector circuit.

What is claimed is:

1. A sensor signal detector that is configured to detect a change in a DC sensor signal based on a change in a physical amount to be detected, the sensor signal detector comprising:

a low-pass filter that is configured to receive the DC sensor signal in which a DC-level fluctuation component being superimposed with a low-frequency state change component and a high-frequency noise component, the low-pass filter being configured to block the high-frequency noise component and the DC-level fluctuation component in the received DC sensor signal to output the low-frequency state change component;

a reference signal generator that is configured to generate a reference signal from the DC sensor signal passing through the low-pass filter;

a trigger signal output unit that is configured to compare the DC sensor signal with the reference signal and outputs a trigger signal based on a result of a comparison between the DC sensor signal and the reference signal; and a reference signal holder that is configured to hold the reference signal when the trigger signal is started to be outputted, the held reference signal being outputted to the trigger signal output unit while the trigger signal is outputted, the trigger signal output unit using the reference signal outputted by the reference signal holder for the comparison between the DC sensor signal and the reference signal, wherein the reference signal holder outputs a variable component derived from the DC sensor signal as the reference signal for all times during which the trigger signal is not outputted, and the reference signal holder outputs the held reference signal for all times during which the trigger signal is outputted, and the reference signal is held at the reference signal holder by storing an electric charge in a capacitor to hold a voltage.

2. The sensor signal detector according to claim 1, wherein the DC sensor signal is obtained by extracting amplitude information from a sinusoidal output signal of a touch signal probe driven by a piezoelectric element.

3. The sensor signal detector according to claim 1, wherein the reference signal holder is located after the reference signal generator and prior to the trigger signal output unit.

4. The sensor signal detector according to claim 1, wherein the reference signal holder comprises a switch and the capacitor, the switch being configured to be set ON for all times during which the trigger signal is not outputted and to be set OFF for all times during which the trigger signal is outputted.

* * * * *